United States Patent [19]

Niki

[11] 4,127,809
[45] Nov. 28, 1978

[54] PULSE MODULATED WAVE MEASURING DEVICE

[75] Inventor: Shoji Niki, Gyoda, Japan

[73] Assignee: Takeda Riken Kogyo Kabushikikaisha, Tokyo, Japan

[21] Appl. No.: 855,583

[22] Filed: Nov. 29, 1977

[30] Foreign Application Priority Data

Dec. 8, 1976 [JP] Japan .................. 51-148084

[51] Int. Cl.² ........................... G01R 25/02
[52] U.S. Cl. .................. 324/78 R; 324/78 D; 324/18 G
[58] Field of Search ............... 324/77 R, 78 R, 78 D, 324/186, 187

[56] References Cited

U.S. PATENT DOCUMENTS 3,731,194  5/1973  Favin et al. .................. 324/186
3,760,269  9/1973  Beeman et al. ................ 324/186

Primary Examiner—M. Tokar
Attorney, Agent, or Firm—Pollock, Vande Sande and Priddy

[57] ABSTRACT

The rise of an intermittently incoming pulse modulated wave is detected to open a gate circuit by the detected output to supply therethrough a clock pulse of a frequency higher than the carrier frequency of the incoming pulse modulated wave to a counter and a pulse decay detector for counting with the former and resetting the latter every carrier cycle of the pulse modulated wave. While the pulse modulated wave continue, the pulse decay detector is repeatedly reset to be prevented from overflowing. Upon interruption of the pulse modulated wave, the pulse decay detector overflows to provide an output after the elapse of predetermined time selected to be longer than one carrier cycle. By the overflow signal, the gate circuit is closed to stop the counting operation of the counter and the numerical value corresponding to the predetermined time is subtracted from the count value of the counter, thereby obtaining the pulse width of the pulse modulated wave. Further, a second counter is provided for counting the carrier cycle of the pulse modulated wave and its carrier frequency is also measured from the count value of the second counter and the pulse width.

9 Claims, 14 Drawing Figures

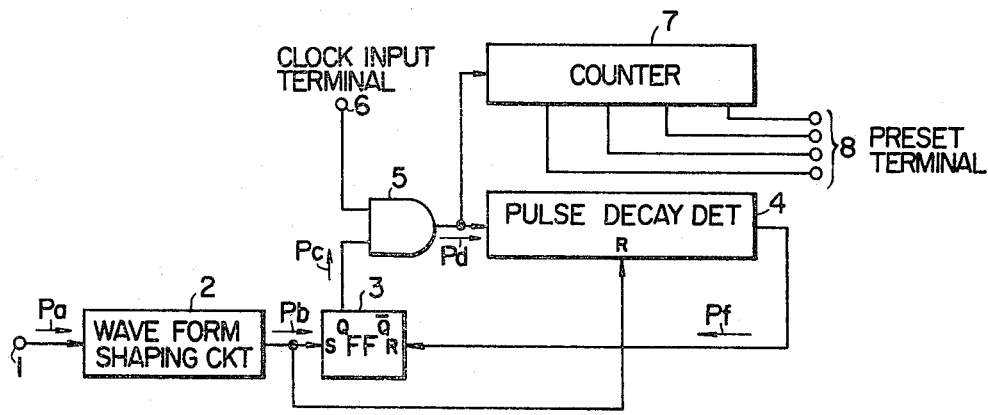
FIG. 1
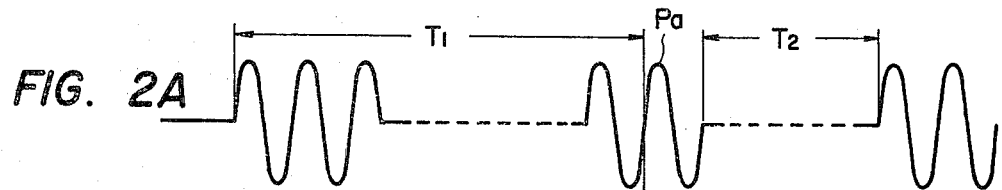
FIG. 2A
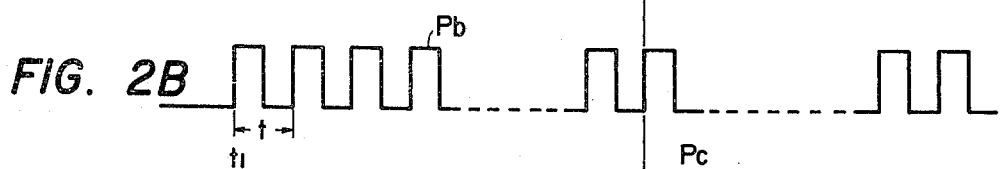
FIG. 2B
FIG. 2C
FIG. 2D
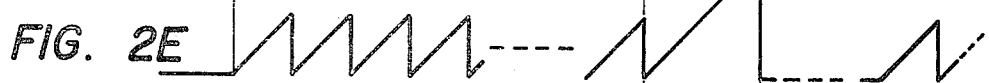
FIG. 2E
FIG. 2F

PULSE MODULATED WAVE MEASURING DEVICE

BACKGROUND OF THE INVENTION

This invention relates to a device for measuring the pulse width or/and the carrier frequency of a pulse modulated wave that very high-frequency carriers are intermittently sent out, such as, for example, an electric wave transmitted from a radar.

In general, there has not been developed a proper method for measuring the pulse width and the carrier frequency of a pulse modulated wave that its carrier signal is modulated by a pulse and that the carrier is intermittently outputted, such as an electric wave transmitted from a radar. A feasible method is to detect the pulse modulated wave with a detector and measure the pulse width of a rectangular wave obtained by the detection. However, in order that a rectangular wave having the pulse width corresponding to the duration of the pulse modulated wave may be derived at the output of the detector, a smoothing low-pass filter which has a time constant sufficiently larger than the cycle of the modulated wave is included in the detector and the pulse width of the smooth output signal from the low-pass filter is measured. Accordingly, the output from the low-pass filter has a dull waveform which rises and falls in accordance with the time constant of the low-pass filter. In the measurement of the pulse width of a waveform having dull rise and fall, a large error is inevitable, as is well-known in the art.

In the case of measuring the carrier frequency of the intermittently supplied pulse modulated wave with, for instance, a digital counter, a gate circuit for gating the signal to be measured can be controlled by the rise of the pulse modulated wave but it is difficult to detect the moment of termination of the pulse modulated wave. Therefore, the gating time of the gate circuit is set by presumption. On the other hand, since the frequency measuring method of the digital counter is to divide the number of input pulses by the gating time, the presumed gating time leads to lack of accuracy in measurement. In the case of a pulse modulated wave of a low frequency, the frequency of the modulated wave can be measured by suitable means such, for example, as an oscilloscope but it is regarded as very difficult to measure the pulse width and the carrier frequency of a pulse modulated wave of an extremely high carrier frequency such as a radar wave.

An object of this invention is to provide a pulse modulated wave measuring device which is capable of accurate measurement of the pulse width of a pulse modulated wave having an extremely high frequency.

Another object of this invention is to provide a pulse modulated wave measuring device which is capable of automatic measurement of the pulse width of a pulse modulated wave.

Another object of this invention is to provide a pulse modulated wave measuring device which is capable of automatic measurement of the carrier frequency of a pulse modulated wave having an extremely high frequency.

Still another object of this invention is to provide a pulse modulated wave measuring device which is capable of automatic measurement of the pulse width and the carrier frequency of a pulse modulated wave.

SUMMARY OF THE INVENTION

In accordance with one aspect of this invention, a gate circuit is opened with the rise of a pulse modulated wave and a clock pulse of a frequency higher than the carrier frequency of the pulse modulated wave is applied to a counter and a pulse decay detector to start them. The pulse decay detector provides a known time. And is reset every cycle of the carrier of the pulse modulated wave. Upon interruption of the pulse modulated wave, the pulse decay detector provides an output after a predetermined period of time and this output signal is applied to the gate circuit to close it. In this while, the numerical value corresponding to the time for the pulse decay detector to produce the output is subtracted from the count value of the counter. Based on the result of this subtraction, the pulse width of the pulse modulated wave is measured.

In accordance with another aspect of this invention, a second counter is provided for counting the carrier cycle of the pulse modulated wave and the count value of the second counter is divided by the time corresponding to the pulse width of the pulse modulated wave, by which its carrier frequency of the pulse modulated wave can be automatically measured.

BRIEF DESCRIPTION OF THE DRAWINGS

FIG. 1 is a block diagram illustrating an embodiment of the pulse modulated wave measuring device of this invention;

FIGS. 2A to 2F are, inclusive, waveform diagrams explanatory of the operation of the embodiment of this invention;

DESCRIPTION OF THE PREFERRED EMBODIMENTS

Figures 3, 5B:
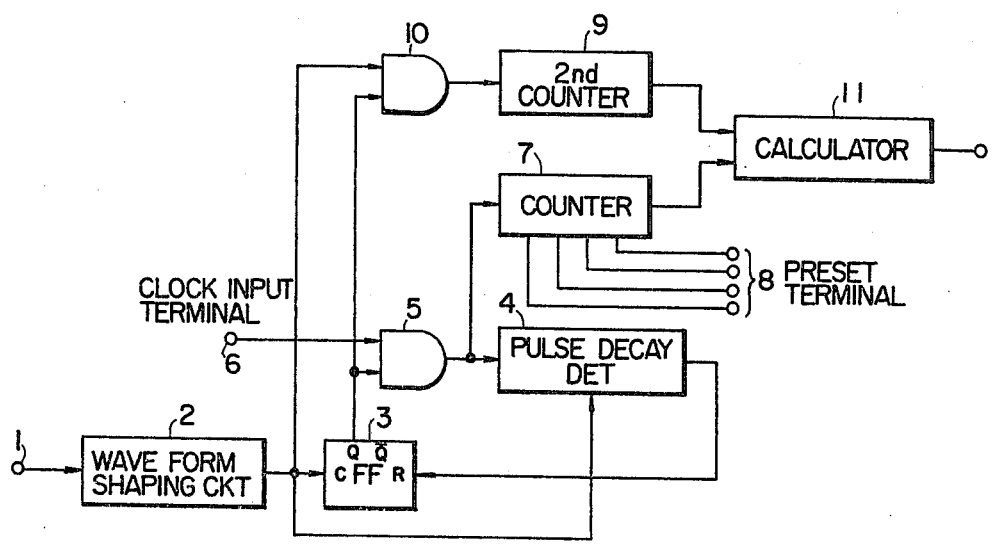
FIG. 3 is a block diagram showing another embodiment of this invention.
FIGS. 5A to 5E, inclusive, are waveform diagrams explanatory of the operation of the embodiment shown in FIG. 4.
Figure 5A:
Figure 5C:
Figure 5D:
Figure 5E:
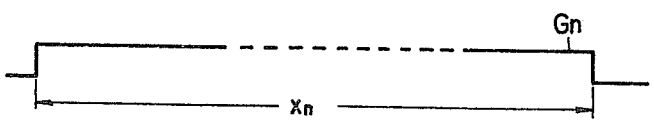

FIG. 1 illustrates an embodiment of this invention. In FIG. 1, reference numeral 1 indicates an input terminal for a signal to be measured. To the input terminal 1 is supplied such a pulse modulated wave Pa as shown in FIG. 2A. The pulse modulated wave Pa is waveform shaped by a waveform shaping circuit 2 into such a rectangular wave Pb as depicted in FIG. 2B. The waveform shaping circuit 2 may be, for instance, a Schmidt trigger circuit. The output from the waveform shaping circuit 2 is supplied to a set terminal S of a flipflop circuit, for example, an Rs flipflop circuit 3, and a reset terminal R of a pulse decay detector 4. An output signal Pc (FIG. 2C) from an output terminal Q of the Rs flipflop circuit 3 is applied to one input terminal of a gate circuit 5, the other input terminal of which is supplied with a clock pulse from a clock input terminal 6. This clock pulse Pd (FIG. 2D) is selected to have a known frequency higher than the carrier of the pulse modulated wave. The clock pulse Pd gated by the gate circuit 5 is applied to the pulse decay detector 4 and a counter 7 having preset terminals 8 and the output signal from the pulse decay detector 4 is supplied to the reset terminal R of the flipflop circuit 3. The pulse decay detector 4 may be formed with a circuit which provides an output a predetermined period of time after supplied with an input. In the illustrated embodiment, the pulse decay detector 4 is described to be formed with a counter. Assume that the counter forming the pulse decay detector 4 overflows to provide an output signal when having reached a predetermined count value, for instance, when having counted one hundred pulses. The frequency of the clock pulse $Pd$ and the time for providing the output from the pulse decay detector 4 are selected such that the pulse decay detector 4 does not overflow with one cycle of the carrier of the signal $Pa$ to be measured but overflows with a period of time shorter than the quiescent or interrupted time $T_2$ of the pulse modulated wave. Thus, when the pulse modulated wave $Pa$ is supplied to the input terminal 1, the output at the output terminal Q of the $Rs$ flip-flop circuit 3 rises up to logic "1" at the moment $t_1$ of rise of the pulse the pulse modulated wave $Pa$, as shown in FIG. 2C, thereby opening the gate circuit 5 to permit the passage therethrough of the clock pulse $Pd$ to the pulse decay detector 4 and the counter 7. The frequency of the clock pulse $Pd$ and the number of steps of the pulse decay detector 4 are selected so that the pulse decay detector 4 does not overflow with one cycle $t$ of the carrier of the pulse modulated wave but overflows with a period of time shorter than the quiescent time $T_2$ of the pulse modulated wave. Since the output from the waveform shaping circuit 2 is supplied to the reset terminal R of the pulse decay detector 4, its count value is reset upon every rise of the waveform-shaped output $Pb$. In consequence, the count content of the counter forming the pulse decay detector 4 is reset before its full count value K is reached and while the carrier of the modulated wave is present, the pulse decay detector is repeatedly reset and does not provide any overflow signal, as shown in FIG. 2E.

When the carrier of the pulse modulated wave breaks off, the count content of the counter making up the pulse decay detector 4 approaches the full count value K to output an overflow signal $Pf$ (FIG. 2F), by which the $Rs$ flip-flop circuit 3 is reset. Accordingly, the gate circuit 5 is closed at the moment $t_2$ and the number of the clock pulses $Pd$ from the moment $t_1$ to $t_2$ is stored in the counter 7. Since the full count value of the pulse decay detector 4 is known, this count value is subtracted from the count value of the counter 7. To perform this, the number that the full count value of the pulse decay detector 4 is subtracted from the full count value of the counter 7 is preset in the counter 7 through its preset terminal 8 and the counting of the counter 7 is started with the preset value. In such a case, when the counter 7 has counted the full count value of the pulse decay detector 4, it overflows and then resumes its counting from the state of "zero." As a result of this, when the counting operation of the counter 7 is stopped by the overflow signal of the pluse decay detector 4, the count value of the counter is made to be the value that the full count value of the pulse decay detector 4 is subtracted from the count value of the counter 7. From the resulting count value, the pulse width T of the pulse modulated wave $Pa$ can be obtained.

The time $\tau$ necessary for the pulse decay detector 4 to reaches its full count value includes the last one cycle of the pulse modulated wave $Pa$. Consequently, the pulse width T, which is obtained by subtracting from the count value of the counter 7 the numerical value corresponding to the time $\tau$, is smaller than the actual pulse width by the time corresponding to one cycle of the carrier. In this instance, since the pulse width T includes hundreds to thousands of cycles of carriers, an error of one cycle is negligible.

FIG. 3 illustrates another embodiment of this invention, which employs a second counter 9. In this embodiment, the number of cycles of the carrier present in the pulse modulated wave $Pa$ is counted by the second counter 9 and the count value is divided by the pulse width the first counter 7, thereby to calculate the carrier frequency of the pulse modulated wave $Pa$.

To this end, a second gate circuit 10 is provided, which is opened and closed under the control of the output at the output terminal Q of the $Rs$ flip-flop circuit 3 to gate the output pulse $Pb$ (FIG. 2B) from the waveform shaping circuit 2 and the gated output is counted by the second counter 9. The resulting count value is supplied to a calculator 11, in which the count value of the counter 9 is divided by the numerical value corresponding to the pulse width T obtained with the first counter 7, calculating the frequency of the pulse modulated wave.

Figure 4:
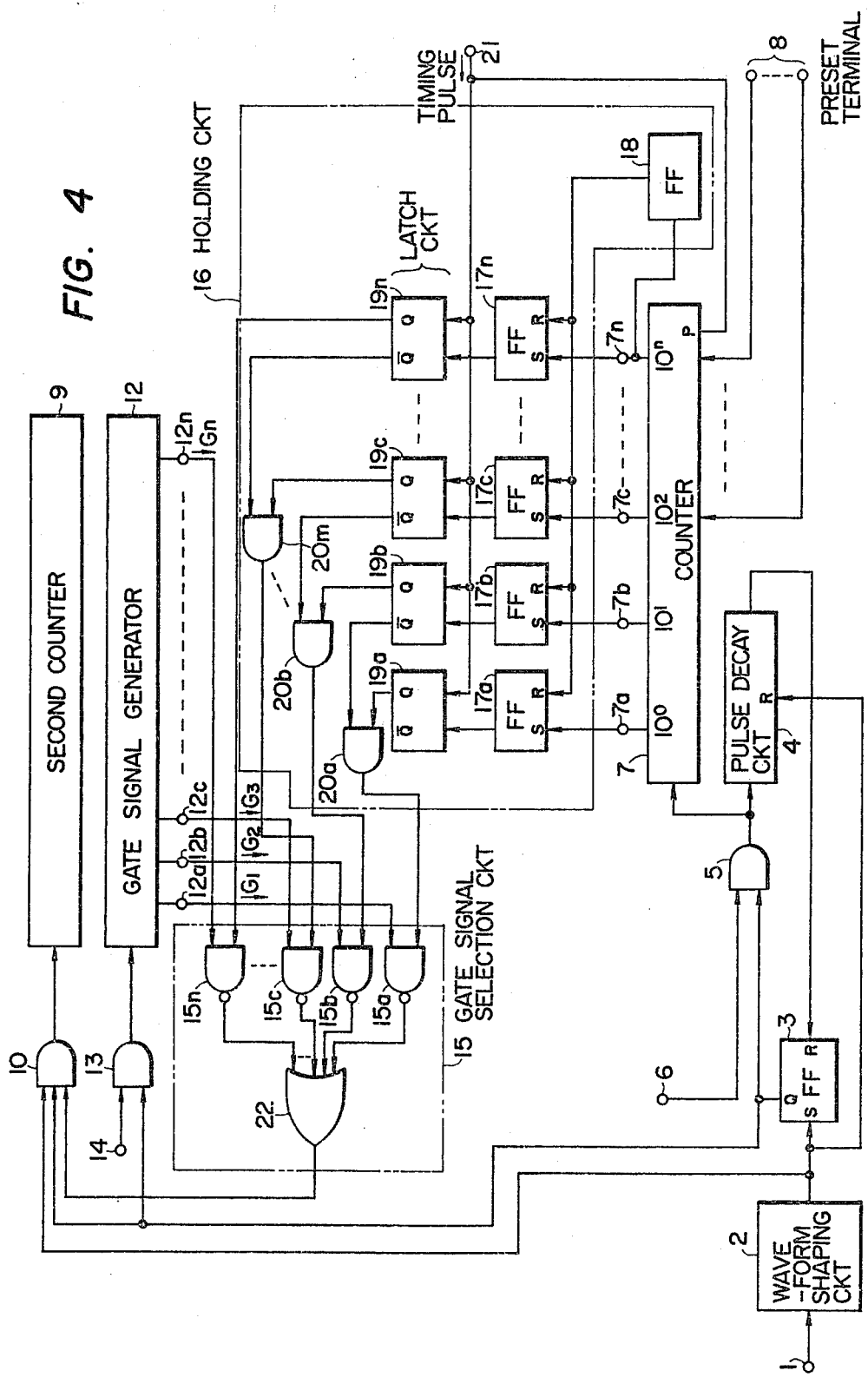
FIG. 4 is a block diagram illustrating another embodiment of this invention.

FIG. 4 shows another embodiment of this invention, in which the rectangular wave $Pb$ supplied to the frequency measuring counter 9 is gated by the gate circuit 10 for a predetermined unit time and the number of the rectangular waves passing through the gate circuit 10 in the unit time is counted to measure the carrier frequency of the pulse modulated wave. That is, the pulse frequency can be obtained by counting the number of pulses passing through the gate circuit 10 in a known time. For enhancement of the accuracy of measurement, it is necessary to count as many rectangular waves as possible in the unit time. If the gate time is fixed at a certain value, an error occurs in the measurement of a pulse modulated wave whose pulse duration is shorter than the gate time.

To avoid this, a gate signal generator 12 is provided which generates gate signals having pulse widths of various unit times. Then, that one of the gate signals from the gate signal generator 12 whose duration is the longest in the pulse width T of the pulse modulated wave is selected and used. The gate signal generator 12 comprises, for instance, a plurality of set-reset flip-flop circuits and a ring counter. To the set terminals of the flip-flop circuits is supplied the output from the output terminal Q of the flip-flop circuit 3 to set the flip-flop circuits with the rise of the set output from the flip-flop circuit 3. To the ring counter is applied a clock pulse of a known frequency from an AND gate 13 and pulses from a plurality of output terminals of the ring counter are respectively applied to the reset terminals of the corresponding ones of the flip-flop circuits. The set outputs from the plurality of flip-flop circuits are provided to output terminals 12$a$, 12$b$, 12$c$, ... 12$n$. With such an arrangement, there are obtained gate signals $G_1$, $G_2$, $G_3$, ... $G_n$ respectively having pulse widths $X_1$, $X_2$, $X_3$, ... $X_n$ from the moment of start of the clock pulse supply, as shown in FIG. 5. The pulse widths $X_1$ to $X_n$ of the gate signals $G_1$ to $G_n$ are respectively set to be unit time widths which are defined to be, for instance, 10ns, 100ns, 1ms, 10ms, 100ms, 1s, etc. The gate signals $G_1$ to $G_n$ thus obtained are supplied to a gate signal selection circuit 15. The gate signal selection circuit 15 selects the gate signal which has the longest gate time in the pulse width T of the pulse modulated wave $Pa$. A control signal for the selection of such a gate signal is obtained by supplying a holding circuit 16 with the count outputs derived at count output terminals 7$a$, 7$b$, 7$c$, ... 7$n$ of the counter 7, respectively.

The holding circuit 16 is composed of a plurality of flip-flop circuits 17a, 17b, 17c . . . 17n which are supplied at set terminals with the count outputs from the count output terminals 7a, 7b, 7c, . . . 7n of the counter 7, another flip-flop circuit 18 which is set by the output of the most significant digit of the counter 7 to reset the flip-flop circuits 17a to 17b, latch circuits 19a, 19b, 19c, . . . 19n for latching the outputs from the flip-flop circuits 17a to 17n and AND gate circuits 20a, 20b, 20c, . . . 20m each of which provides the logical product of the output from the set output terminal Q of the immediately preceding one of the latch circuits and the output from the inverted set output terminal $\overline{Q}$ of the immediately following latch circuit. The value that the full count value of the pulse decay detector 4 is subtracted from the full count value of the counter 7 is previously applied to the preset terminals 8 of the counter 7. Each time the pulse modulated wave Pa is interrupted, a timing pulse is applied to a terminal 21 connected to a preset instruction terminal P of the counter 7, presetting the preset value supplied to the preset terminals 8 of the counter 7. Accordingly, counting of the counter 7 starts with the preset value, and when the counting reaches the full count value, the counter 7 once overflows and returns to its initial state and resumes counting from the initial state. In this manner, the full count value of the pulse decay detector 4 is subtracted from the count value of the counter 7. On the other hand, when the counter 7 overflows, the flip-flop circuit 18 is set by the overflow signal and, by the set output from the flip-flop circuit 18, the flip-flop circuits 17a to 17n are all put in their reset state. Consequently, in this state, the outputs from the flip-flop circuits 17a to 17n are all made to have logic "1." The output terminals Q of the flip-flops 17a to 17n are connected to the input terminals of the latch circuits 19a to 19n, respectively. Each time the pulse modulated wave Pa is interrupted, the latch circuits 19a to 19n are each supplied with the timing pulse from the terminal 21 to read in the output from each of the flip-flop circuits 17a to 17n. The output terminals of the latch circuits 19a to 19n are connected to the input terminals of the AND gates 20a to 20m, respectively. The AND gate circuits 20a to 20m are connected to the latch circuits 19a to 19n so that each AND gate circuit provides the logical product of the output from the set output terminal Q of the preceding one of adjacent latch circuits and the output from the inverted set output terminal $\overline{Q}$ of the following latch circuit.

With such an arrangement, when the counter 7 overflows and then counts, for instance, one pulse, an output of the logic "1" is derived at the output terminal 7a and, by this output, the first-stage flip-flop circuit 17a is set. Then, when the counter 7 counts, for example, 10 pulses, the logic "1" is outputted at the output terminal 7b to set the flip-flop circuit 17b. Thus, upon every counting of, for example, one, 10, 100, 1,000 and 10,000 pulses, the flip-flop circuits 17a to 17n are set one after another, by which the states of the flip-flop circuits 17a to 17n set at the moment of interruption of the pulse modulated wave are read in the latch circuits 19a to 19n, respectively. Accordingly, for instance, when the flip-flop circuits 17a to 17c are in the set state, the logic "1" is provided at the set output terminal Q of each of the latch circuits 19a to 19c. As a result of this, the logical product of the inputs to each of the AND gate circuits 20a and 20b becomes the logic "0" and, in the state shown, the AND gate 20m outputs the logic "1." When the AND gate 20m thus outputs the logic "1", only the AND gate 15c of the gate signal selection circuit 15 is opened and the gate signal selected by the AND gate 15c in the cycle of the next pulse modulated wave is supplied through an OR gate 22 to the AND gate 10 to open it for the time corresponding to the pulse width of the gate signal $G_3$ selected by the AND gate 15c. In consequence, the pulse modulated wave Pa is supplied to the counter 9 for the unit time to count the carrier cycles.

Accordingly, when the count content of the counter 7 is 1 to 10, the output signal $G_1$ (FIG. 5B/ at the output terminal 12a of the gate signal generator 12 is selected by the AND gate circuit 15a and applied to the gate circuit 10 through the OR gate 22. When the count content of the counter 7 is 11 to 100, the output signal $G_2$ (FIG. 5C) at the output terminal 12b of the gate signal generator 12 is selected by the AND gate circuit 15b and applied to the gate circuit 10. Similarly, when the count content of the counter 7 is 101 to 1000, the gate signal $G_3$ (FIG. 5D) is selected. Thus, as the counting of the counter 7 proceeds, the gate signals $G_1$ to $G_n$ are selected to pick up the gate signal of the longest duration in the pulse width T of the pulse modulated wave Pa. For the unit time of the selected gate signal, the carriers of the pulse modulated wave Pa are applied to the counter 9 for counting, so that the carrier frequency can be obtained from the count value of the counter 9. It will be readily understood from the above that the pulse width T of the pulse modulated wave Pa can also be obtained from the count value of the counter 7.

As described above, it is possible with this invention to measure with high accuracy the pulse width and the carrier frequency of a pulse modulated wave of a very high frequency such as a radar wave. In the embodiment illustrated in FIG. 4, it is also possible to measure the carrier frequency, for instance, by forming a gate signal having a pulse width corresponding to one cycle of the output pulse Pb from the output pulse Pb (FIG. 5B) of the waveform shaping circuit 2, controlling the gate circuit by the gate signal and applying clock pulses of a known frequency to the counter 9 through the gate circuit for counting. In this case, however, since the signal Pb outputted from the waveform shaping circuit 2 has a very high frequency like a radar wave, an ultra-speed responsive counter is required as the counter 9 for counting many clock pulses within the time of one cycle of such a high-frequency signal. At present, however, it is impossible to manufacture such an ultraspeed responsive counter. Although it is described above that a counter capable of counting clock pulses within the time of one cycle of the radar wave is not available, the embodiments shown in FIGS. 1, 3 and 4 employ a counter as the pulse decay detector 4 for counting a certain number of clock pulses Pd (FIG. 2D) within the time of one cycle of the modulated signal of a radar wave. In this instance, however, the number of clock pulses counted in the time of one cycle of the modulated signal may be small and a high-speed responsive counter for counting several clock pulses to a fraction of one clock pulse is available. Accordingly, the present invention can be practiced.

In the foregoing, a counter is employed as the pulse decay detector 4 but a resettable one-shot multivibrator may also be used. The operation of the resettable one-shot multivibrator that it is inverted by every application thereto of a trigger signal and returned to its original state after a certain period of time, is the same as the operation of an ordinary one-shot multivibrator. But when the trigger signal is applied before returning to the original state, the time of return is extended from the moment of application of the trigger signal for the certain period of time. This characteristic can be used as the function of the pulse decay detector employed in this invention. In this case, a clock signal of a higher frequency than the modulated wave may also be used as the trigger signal and, also, the rise or fall of the modulated pulse can be used as the trigger signal. In such a case, the time of return of the multivibrator from its inverted state is selected to be longer than one cycle $t$ of the modulated wave and shorter than the quiescent time $T_2$ of the pulse modulated wave. Also, the pulse decay detector may be, for instance, a step form wave generator which is adapted to raise its output voltage in a stepwise manner upon every application of a clock and to be reset when the output voltage reaches a predetermined value.

It will be apparent that many modifications and variations may be effected without departing from the scope of the novel concepts of this invention.

What is claimed is:

1. A pulse modulated wave measuring device comprising:
   means for detecting and storing the rise of a pulse modulated wave to be measured;
   gate means controlled by the detected output from the detecting means to open;
   a pulse decay detector connected to the output side of the gate means to provide an overflow signal after the elapse of a predetermined time selected to be longer than the carrier cycle of the pulse modulated wave to be measured and shorter than its pulse interval;
   a pulse width counter connected to the output side of the gate means;
   a clock pulse source for applying a clock pulse of a known frequency to the pulse decay detector and the pulse width counter through the gate means;
   reset means for resetting the pulse decay detector upon every rise or fall of the carrier of the pulse modulated wave;
   means for resetting the detecting and storing means with the overflow signal of the pulse decay detector to close the gate means; and
   means for subtracting from the count value of the pulse width counter the numerical value corresponding to the predetermined time.

2. A pulse modulated wave measuring device according to claim 1, wherein the detecting and storing means is a flop-flop circuit.

3. A pulse modulated wave measuring device according to claim 1, wherein the pulse decay detector is a counter which provides an overflow signal upon counting a predetermined number of clock pulses from the clock pulse source and wherein the pulse modulated wave is supplied to a reset terminal of the counter to reset it upon every rise or fall of the pulse modulated wave.

4. A pulse modulated wave measuring device according to claim 3, wherein the detecting and storing means is reset by the overflow signal of the counter forming the pulse decay detector to close the gate means.

5. A pulse modulated wave measuring device according to claim 1, wherein a waveform shaping circuit for shaping the waveform of the carrier of the pulse modulated wave into a rectangular wave is provided at the stage preceding the detecting and storing means.

6. A pulse modulated wave measuring device according to claim 3, wherein the pulse width counter is a preset counter and wherein the numerical value that the number generating a full count signal of the counter forming the pulse decay detector is subtracted from the full count value of the pulse width counter is applied to a preset terminal of the preset counter to form the subtracting means.

7. A pulse modulated wave measuring device according to claim 1, which further includes second gate means controlled by the detecting and storing means to open and close and supplied with the pulse modulated wave to be measured, a second counter connected to the output side of the second gate means, and a divider circuit for dividing the count value of the second counter by the count value of the pulse width counter to obtain the carrier frequency of the pulse modulated wave to be measured.

8. A pulse modulated wave measuring device according to claim 1, which further includes second gate means for obtaining the logical product of the output from the detecting and storing means, a gate signal and the pulse modulated wave to be measured, a second counter connected to the output side of the second gate means to count the carrier cycles of the pulse modulated wave to obtain its carrier frequency, third gate means controlled by the detecting and storing means to permit the passage therethrough of the clock pulse of the known frequency, a gate signal generator connected to the output side of the third gate means to output gate signals of pulse widths of different unit time in synchronism with the rise of the pulse modulated wave to be measured, and a gate signal selection circuit for selecting that one of the gate signals from the gate signal generator which has the largest time in the duration of the pulse modulated wave to be measured and supplying the selected gate signal as the gate signal to the input side of the second gate means.

9. A pulse modulated wave measuring device according to claim 8, which further includes holding means for holding the data corresponding to the pulse width of the pulse modulated wave counted by the pulse width counter, and wherein the output side of the holding means is connected to the gate signal selection circuit to the gate signal selection circuit to select the gate signal to the second gate based on the data held in the holding means.

* * * * *